(12) United States Patent
Sadovnikov et al.

(10) Patent No.: US 6,699,741 B1
(45) Date of Patent: Mar. 2, 2004

(54) SINGLE POLY BIPOLAR TRANSISTOR AND METHOD THAT USES A SELECTIVELY EPITAXIALLY GROWN HIGHLY-BORON-DOPED SILICON LAYER AS A DIFFUSION SOURCE FOR AN EXTRINSIC BASE REGION

(75) Inventors: Alexei Sadovnikov, Sunnyvale, CA (US); Christopher John Knorr, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/222,620

(22) Filed: Aug. 16, 2002

(51) Int. Cl.[7] .............................. H01L 21/336
(52) U.S. Cl. ..................... 438/197; 438/205; 438/313; 438/340; 438/339; 257/565; 257/593; 257/E21.371; 257/E29.044; 257/E29.193; 257/197
(58) Field of Search .................. 257/565, 591, 257/592, 593, 917, E21.371, E29.044, E29.193, 197, 200; 438/197, 311, 322, 364, 202, 205, 313, 340, 366, 368, 369, 370, 365, 350, 343, 345, 339

(56) References Cited

U.S. PATENT DOCUMENTS

| | | | | |
|---|---|---|---|---|
| 5,616,508 A | * | 4/1997 | Johnson | 438/350 |
| 5,643,806 A | * | 7/1997 | Miwa et al. | 438/366 |
| 5,681,765 A | * | 10/1997 | Darmawan | 438/586 |
| 5,766,990 A | * | 6/1998 | El-Diwany | 438/202 |
| 6,459,140 B1 | * | 10/2002 | Johansson et al. | 257/592 |
| 2001/0031521 A1 | * | 10/2001 | Pan et al. | 438/197 |

OTHER PUBLICATIONS

Y. Kinoshita et al., "An Advanced 0.25–μm BiCMOS Process Integration Technology for Multi–GHz Communication LSIs", Proceedings of the 1997 IEEE Bipolar/BiCMOS Circuits and Technology Meeting, pp. 72–75.

* cited by examiner

*Primary Examiner*—Caridad Everhart
*Assistant Examiner*—Belur Keshavan
(74) *Attorney, Agent, or Firm*—Mark C. Pickering (57) ABSTRACT

A high frequency bipolar transistor that has a silicon germanium intrinsic base region is formed in a semiconductor fabrication process that forms the extrinsic base regions after the intrinsic base region has been formed. The extrinsic base regions are epitaxially grown single crystal silicon that is doped during the growth.

17 Claims, 7 Drawing Sheets

SINGLE POLY BIPOLAR TRANSISTOR AND METHOD THAT USES A SELECTIVELY EPITAXIALLY GROWN HIGHLY-BORON-DOPED SILICON LAYER AS A DIFFUSION SOURCE FOR AN EXTRINSIC BASE REGION

BACKGROUND OF THE INVENTION

1. Field of the Invention

The present invention relates to single polysilicon (poly) bipolar transistors and, more particularly, to a single poly bipolar transistor and method that uses a selectively epitaxially grown highly-boron-doped silicon layer as a diffusion source for an extrinsic base region.

2. Description of the Related Art

A bipolar transistor is a three-region device that controllably varies the magnitude of the current that flows through the device. The three regions include a collector, a base that contacts the collector, and an emitter that contacts the base. The charge carriers, which form the current, flow between the collector and the emitter, while variations in the voltage on the base cause the magnitude of the current to vary.

A high frequency bipolar transistor is a transistor that is fast enough to respond to a high frequency input signal. One difference between a standard bipolar transistor and a high frequency bipolar transistor is that the high frequency transistor has a thinner intrinsic base region. As the intrinsic base region gets thinner, the base transit time (the amount of time required for the charge carriers to move through the base) gets smaller, thereby increasing the frequency response of the transistor.

High frequency bipolar transistors are used extensively in RF applications, such as in digital cellular telephones, which operate in the gigahertz frequency range. One problem with high frequency transistors, however, is that the transistors are difficult to fabricate. FIGS. 1A–1H show a series of cross-sectional views that illustrate a method of forming a conventional high frequency bipolar transistor.

Figure 1A:
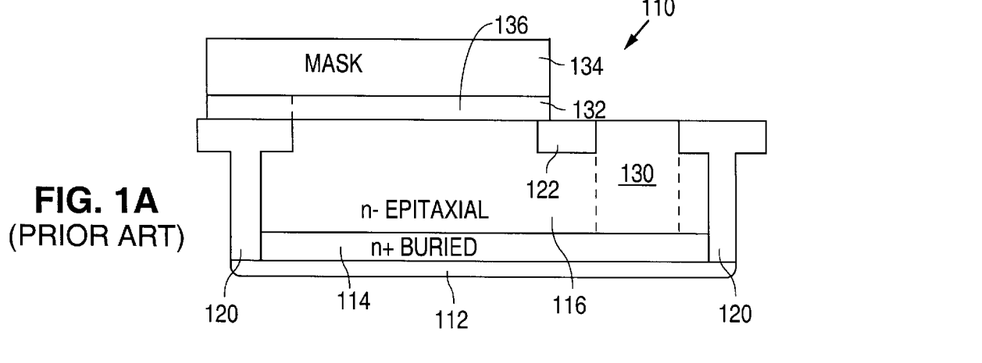
FIGS. 1A–1H are a series of cross-sectional views illustrating a method of forming a conventional high frequency bipolar transistor.

As shown in FIG. 1A, the method utilizes a conventionally-formed wafer 110 that has a substrate layer 112, such as silicon or oxide, and an n+ buried layer 114 that is formed on substrate layer 112. In addition, wafer 110 also has a lightly-doped, n-type epitaxial layer 116 that is formed on n+ buried layer 114.

Wafer 110 further has a deep trench isolation region 120 that isolates epitaxial layer 116 from laterally adjacent regions. A shallow trench isolation region 122 is also formed in epitaxial layer 116. The shallow trench isolation region 122 separates a collector surface area from a base surface area of epitaxial layer 116.

In addition, wafer 110 can optionally include an n+ diffused contact region 130 that extends down from the surface of the collector surface area in epitaxial layer 116 to contact n+ buried layer 114. Contact region 130 is utilized to reduce the series resistance to buried layer 114. N+ buried layer 114, n− epitaxial layer 116, and optional n+ diffused contact region 130 define the collector of the to-be-formed bipolar transistor.

As shown in FIG. 1A, the method begins by forming a layer of p-semiconductor material 132, such as epitaxially grown silicon or silicon germanium, on epitaxial layer 116, isolation regions 120 and 122, and region 130. Following this, a base mask 134 is formed and patterned on layer 132. The exposed regions of layer 132 are then etched away to form a base region 136. Mask 134 is then removed.

Figure 1B:
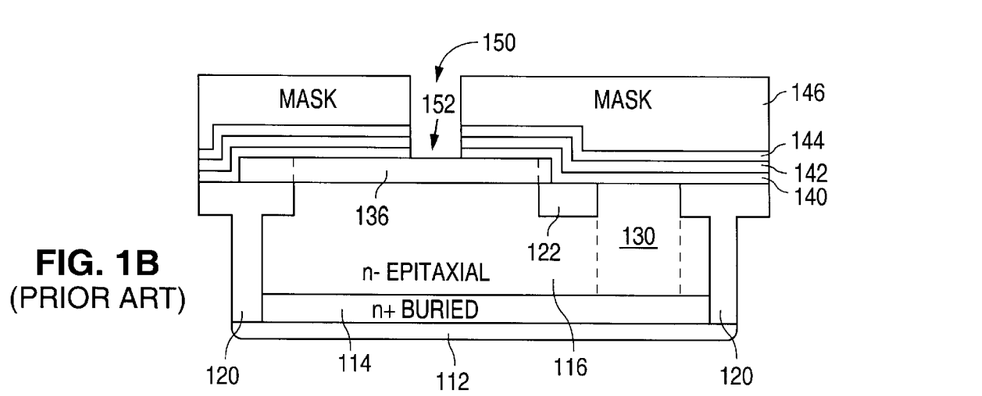

Next, as shown in FIG. 1B, once mask 134 has been removed, a layer of oxide 140 is formed on base region 136, isolation regions 120 and 122, and region 130. After this, a layer of nitride 142 is formed on oxide layer 140, followed by the formation of an overlying layer of oxide 144. After this, an intrinsic base mask 146 is formed and patterned on oxide layer 144.

Next, the exposed regions of oxide layer 144 and underlying layers 142 and 140 are etched away to form an opening 150 that exposes a surface region 152 on the surface of base region 136. Mask 146 is then removed. One drawback of this method is that, because there is no etch stop, etching to expose surface region 152 can damage or destroy base region 136.

Figure 1C:
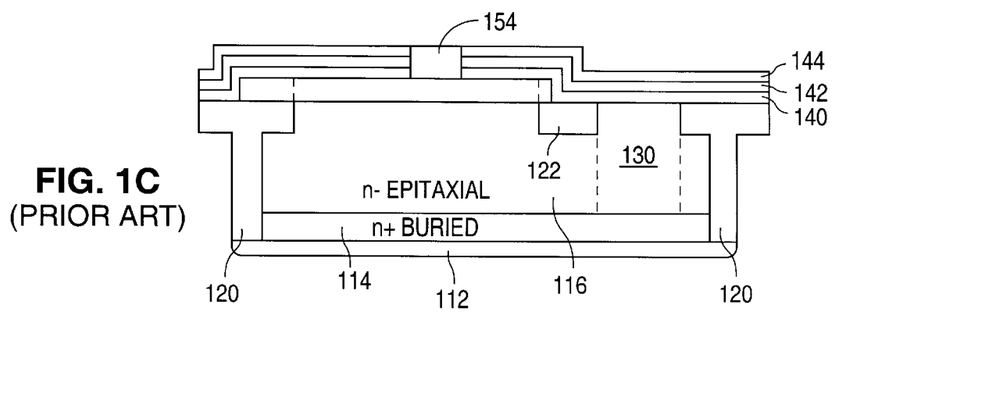

As shown in FIG. 1C, once mask 146 has been removed, a first layer of sacrificial material, such as polysilicon, is formed on oxide layer 144 and surface region 152 to fill up opening 150. The first layer of sacrificial material is then removed from the surface of oxide layer 144 to form a sacrificial region 154.

Figure 1D:
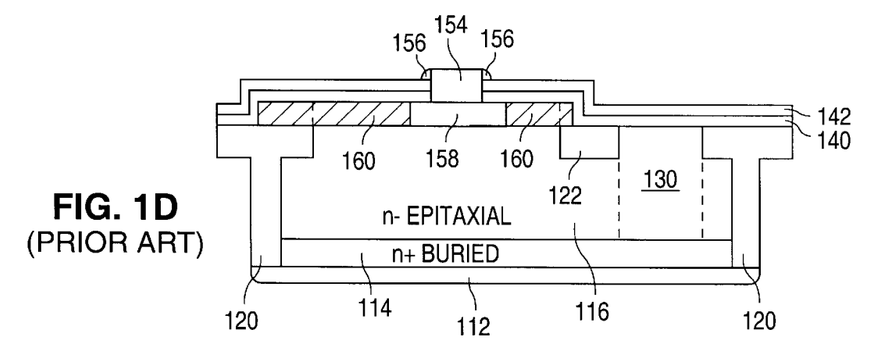

Following this, as shown in FIG. 1D, oxide layer 144 is etched until oxide layer 144 has been removed from the surface of nitride layer 142. After oxide layer 144 has been removed, a second layer of sacrificial material, such as polysilicon, is formed on nitride layer 142 and sacrificial region 154.

The second layer of sacrificial material is then anisotropically etched to form a sacrificial spacer 156 on nitride layer 142. After spacer 156 has been formed, wafer 110 is implanted with boron to define a lightly-doped intrinsic base region 158, and form highly-boron-doped extrinsic base regions 160 on opposite sides of intrinsic base region 158. The implant damages the lattice and causes defects in regions 160, the regions that receive the implant.

Figure 1E:
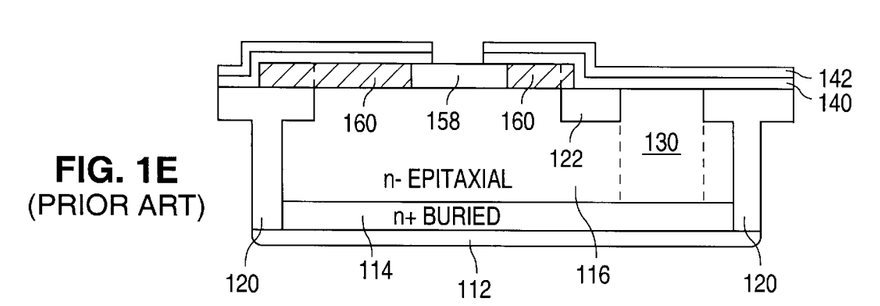
Figure 1F:
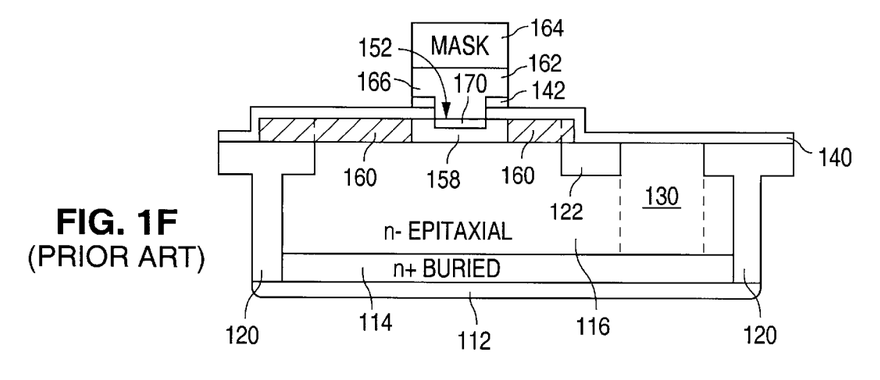

As shown in FIG. 1E, following the implant, sacrificial regions 154 and 156 are removed. Another drawback of this method is that re-etching to expose surface region 152 can again damage or destroy base region 136/intrinsic base region 158. Next, as shown in FIG. 1F, a layer of polysilicon (poly) 162 is formed on surface region 152 and nitride layer 142 to fill up the opening.

Poly layer 162 can be doped in situ or via ion implantation after formation to have an n+ dopant concentration. Following this, an emitter mask 164 is formed and patterned on poly layer 162. Next, the exposed regions of poly layer 162 and the underlying layer of nitride 142 are etched away to form an extrinsic emitter 166. Mask 164 is then removed.

After mask 164 has been removed, wafer 100 is thermally cycled to cause the dopants in extrinsic emitter 166 to out diffuse into base region 136 to form an intrinsic emitter region 170. The thermal step also anneals the lattice damage caused by the boron implant. Another drawback of this method is that the drive-in/anneal step causes dopants from base region 160 to diffuse into intrinsic base region 158, thereby widening intrinsic base region 158. This is because the implantation defects enhance the diffusion of the boron.

Figure 1G:
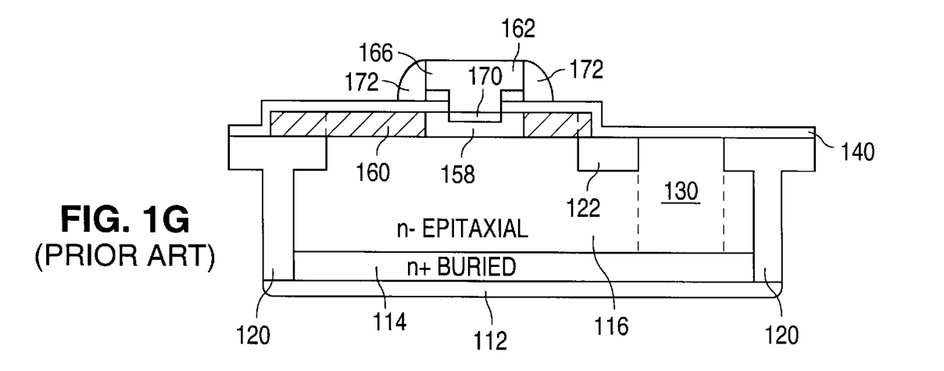
Figure 1H:
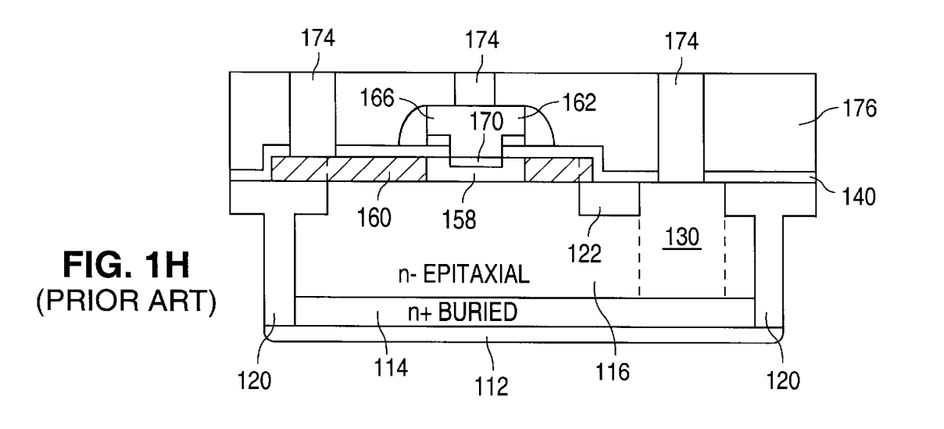

After the thermal cycle is complete, a layer of isolation material is formed on emitter 166 and oxide layer 140. As shown in FIG. 1G, the layer of isolation material is then anisotropically etched to form an isolation spacer 172 on oxide layer 140. As shown in FIG. 1H, after spacer 172 has been formed, contacts 174 are conventionally formed through a layer of insulation material 176.

Thus, the method shown in FIGS. 1A–1H suffers from a number of drawbacks, including two etch steps that expose the surface of the intrinsic base region, and an implant step that causes base-widening dopant diffusion during a subsequent thermal step.

Other prior art methods also suffer from drawbacks. When the intrinsic and extrinsic bases are formed at different points in the process, if the intrinsic base region is formed prior to an extrinsic base polysilicon layer, then the subsequent etch of the extrinsic base polysilicon layer to expose the intrinsic base region can damage or destroy the intrinsic base region because there is no etch stop.

On the other hand, if the extrinsic base polysilicon layer is formed prior to the intrinsic base region, then out diffusion from the heavily-doped extrinsic base region contaminates the lightly-doped intrinsic base region. Thus, there is a need for a method of forming a high frequency bipolar transistor that addresses these drawbacks.

SUMMARY OF THE INVENTION

The present invention provides a high frequency bipolar transistor that has a silicon germanium intrinsic base region that is formed before the extrinsic base regions are formed. A bipolar transistor in accordance with the present invention includes a layer of semiconductor material of a first conductivity type, and an intrinsic base region of a second conductivity type that is formed on the layer of semiconductor material. The bipolar transistor also includes spaced-apart extrinsic base regions of the second conductivity type that are formed on the intrinsic base region.

Further, the bipolar transistor includes isolation caps that are formed on the extrinsic base regions, and spacers that adjoin the side walls of the extrinsic base regions to contact the isolation caps. The bipolar transistor additionally includes an intrinsic emitter of the first conductivity type that is formed in the surface of the intrinsic base region, and an extrinsic emitter of the first conductivity type that is formed on the isolation caps and the spacers to contact the intrinsic emitter region.

The present invention also includes a method of forming a bipolar transistor that includes the step of forming a first layer of isolation material on a semiconductor material. The first layer of isolation material exposes a base surface area of the semiconductor material. The method also includes the steps of forming a first layer of conductive material on the base surface area and the first layer of isolation material, and forming a mandrel on the first layer of conductive material over the base surface area.

In addition, the method includes the steps of forming a second layer of conductive material on the first layer of conductive material around the mandrel, and forming a second layer of isolation material on the second layer of conductive material. Further, a first portion of the mandrel is removed after the second layer of isolation material has been formed.

The method also includes the step of etching the second layer of isolation material, the second layer of conductive material, and the first layer of conductive material after the second layer of isolation material has been formed to form an intrinsic base region that contacts the base surface area, spaced-apart extrinsic base regions that contact the intrinsic base region, and isolation caps that contact and cover the extrinsic base regions. The base regions have side walls, and are separated by the mandrel.

The method further includes the steps of forming spacers on the side walls, and removing a second portion of the mandrel after the base regions have been formed to expose a surface region of the first layer of conductive material. Further, an extrinsic emitter is formed that contacts the surface region of the first layer of conductive material.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 2:
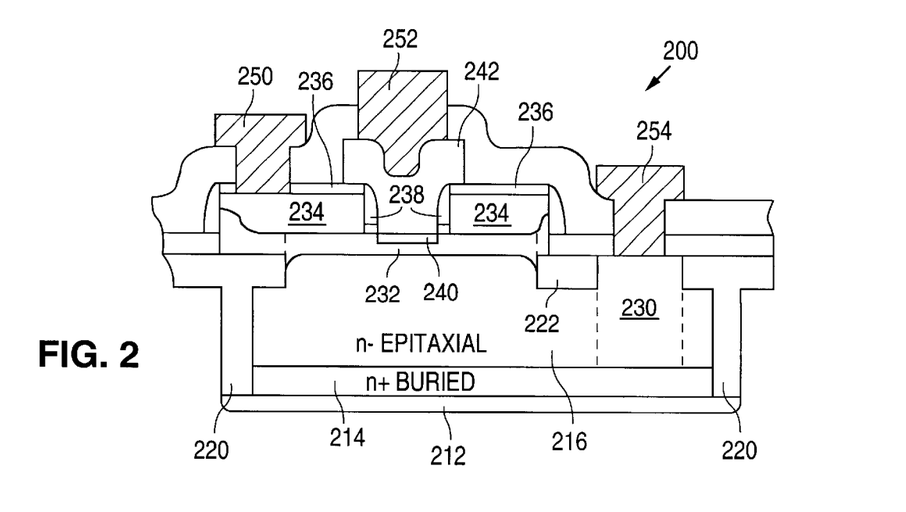
FIG. 2 is a cross-sectional view illustrating an example of a high-frequency bipolar transistor 200 in accordance with the present invention.

FIG. 2 shows a cross-sectional view that illustrates an example of a high-frequency bipolar transistor 200 in accordance with the present invention. As described in greater detail below, the extrinsic base regions of the transistor are formed as single crystal silicon that are doped during the process used to form the single crystal silicon. As a result, dopant diffusion that alters the width of the base region as a result of thermal cycling during fabrication is reduced.

As shown in FIG. 2, transistor 200 has substrate layer 212, such as silicon or oxide, and an n+ buried layer 214 that is formed on layer 212. In addition, transistor 200 has an n—epitaxial layer 216 that is formed on n+ buried layer 214. Transistor 200 further has a deep trench isolation region 220 that isolates epitaxial layer 216 from laterally adjacent regions. A shallow trench isolation region 222 is also formed in epitaxial layer 216. The shallow trench isolation region 222 separates a collector surface area from a base surface area of the bipolar transistor.

In addition, transistor 200 can optionally include an n+ diffused contact region 230 that extends down from the collector surface area in epitaxial layer 216 to contact n+ buried layer 214. Contact region 230 is utilized to reduce the series resistance to n+ buried layer 214. N+ buried layer 214, n—epitaxial layer 216, and optional n+ diffused contact region 230 define the collector of the bipolar transistor.

As further shown in FIG. 2, transistor 200 includes an intrinsic base region 232 that is formed on n—epitaxial layer 216, and spaced-apart extrinsic base regions 234 that are formed on intrinsic base region 232. In this example, intrinsic base region 232 can be formed with, for example, silicon or silicon germanium.

Base regions 232 and 234 are both doped to have a p-type conductivity, with base region 234 having a substantially larger dopant concentration than that of base region 232. By using a thin layer of silicon or silicon germanium to form base region 232, the operational frequency of transistor 200 is increased.

In addition, transistor 200 includes isolation caps 236 that are formed over extrinsic base regions 234, and spacers 238 that adjoin the side walls of the extrinsic base regions 234 to contact caps 236. Transistor 200 also includes an n+ intrinsic emitter 240 that is formed in the surface of intrinsic base region 232, and an n+ extrinsic emitter 242 that is formed on isolation caps 234 and spacers 238 to contact intrinsic emitter region 240.

Further, transistor 200 includes a base contact 250 that makes an electrical connection with an extrinsic base region 234, and an emitter contact 252 that makes an electrical connection with extrinsic emitter 242. In addition, a collector contact 254 makes an electrical connection with epitaxial region 216 or region 230.

Figure 3A:
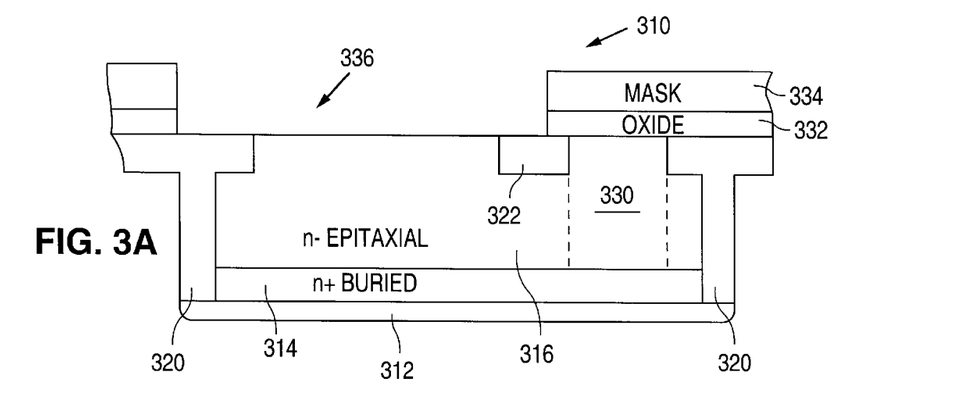
FIGS. 3A–3L are cross-sectional views illustrating an example of a method of forming a high frequency bipolar transistor in accordance with the present invention.

FIGS. 3A–3L are cross-sectional views that illustrate an example of a method of forming a high frequency bipolar transistor in accordance with the present invention. As shown in FIG. 3A, the method utilizes a conventionally-formed wafer 310 that has a substrate layer 312, such as silicon or oxide, and an n+ buried layer 314. In addition, the wafer also has a lightly-doped, n-type epitaxial layer 316 that is formed on n+ buried layer 314.

The wafer further has a deep trench isolation region 320 that isolates epitaxial layer 316 from laterally adjacent regions. A shallow trench isolation region 322 is also formed in epitaxial layer 316. The shallow trench isolation region 322 separates a collector surface area from a base surface area of epitaxial layer 316.

In addition, the wafer can optionally include an n+ diffused contact region 330 that extends down from the surface of the collector surface area in epitaxial layer 316 to contact n+ buried layer 314. Contact region 330 is utilized to reduce the series resistance to buried layer 314. N+ buried layer 314, n— epitaxial layer 316, and optional n+ diffused contact region 330 define the collector of the to-be-formed bipolar transistor.

As shown in FIG. 3A, the method of the present invention begins by forming a layer of isolation material 332, such as oxide, approximately 40 nm thick on epitaxial layer 316 and contact region 330. Once isolation layer 332 has been formed, a base definition mask 334 is formed and patterned on isolation layer 332 to expose a region of layer 332. Once mask 334 has been patterned, the exposed region of isolation layer 332 is etched away to expose a base window 336 on the surface of epitaxial layer 316. Mask 334 is then stripped.

Figure 3B:
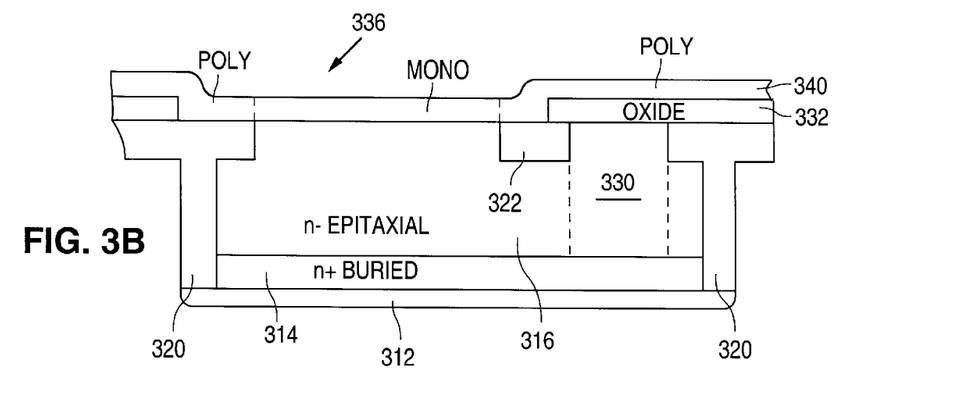

Next, as shown in FIG. 3B, a layer of semiconductor material 340, such as silicon or silicon germanium, is epitaxially grown on epitaxial layer 316 in base window 336, and isolation layer 332. (A silicon germanium layer includes a cap layer of silicon.) When formed in this manner, monocrystalline silicon grows on epitaxial layer 316, while polysilicon grows on isolation regions 320 and 322, and isolation layer 332.) Layer 340 is doped as it is grown with a p-type dopant using conventional methods, such as solid source diffusion, to have a conductivity type opposite that of n– epitaxial layer 316.

Figure 3C:
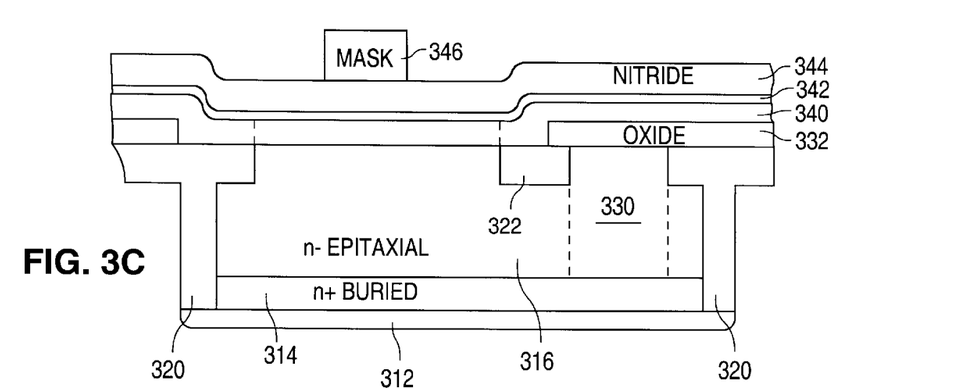

After this, as shown in FIG. 3C, a first layer of isolation material 342, such as oxide, is formed on layer 340, followed by the formation of a second layer of isolation material 344, such as nitride, on isolation layer 342. (A single layer of isolation material can alternately be formed.) Once isolation layer 344 has been formed, a mandrel definition mask 346 is formed and patterned on isolation layer 344 to protect a region of layer 344.

Figure 3D:
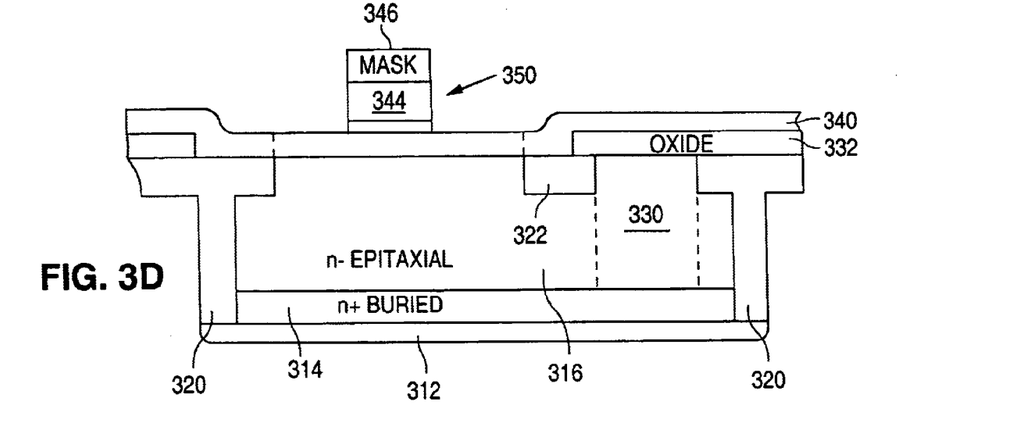

As shown in FIG. 3D, once mask 346 has been patterned, the exposed regions of isolation layer 344 and the underlying region of layer 342 are etched away from the surface of layer 340 to form a mandrel 350 on the surface of layer 340. Mask 346 is then removed.

Figure 3E:
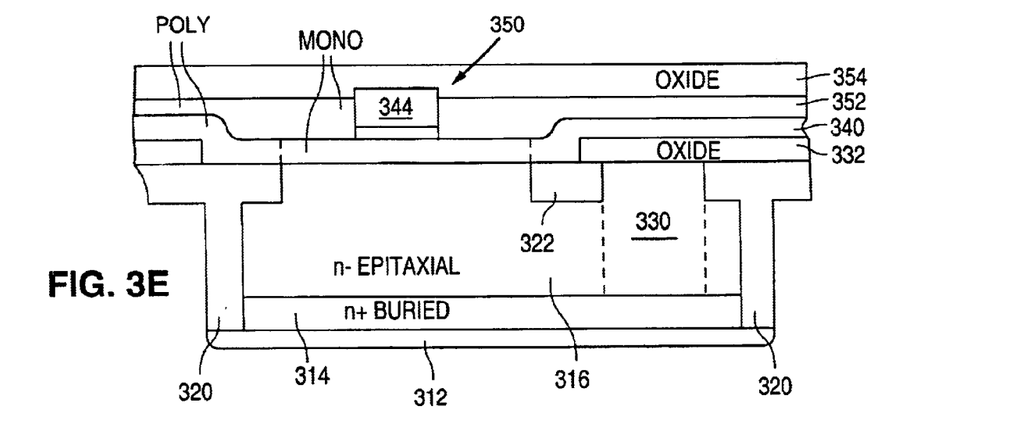

As shown in FIG. 3E, after mask 346 has been removed, a layer of silicon 352 is selectively epitaxially grown on layer 340. Silicon layer 352 does not grow on non-silicon areas, such as mandrel 350, and is highly doped with boron during the growth to have a substantially higher dopant concentration than layer 340. Once layer 352 has been formed, a layer of isolation material 354, such as oxide, is formed on mandrel 350 and silicon layer 352.

Figure 3F:
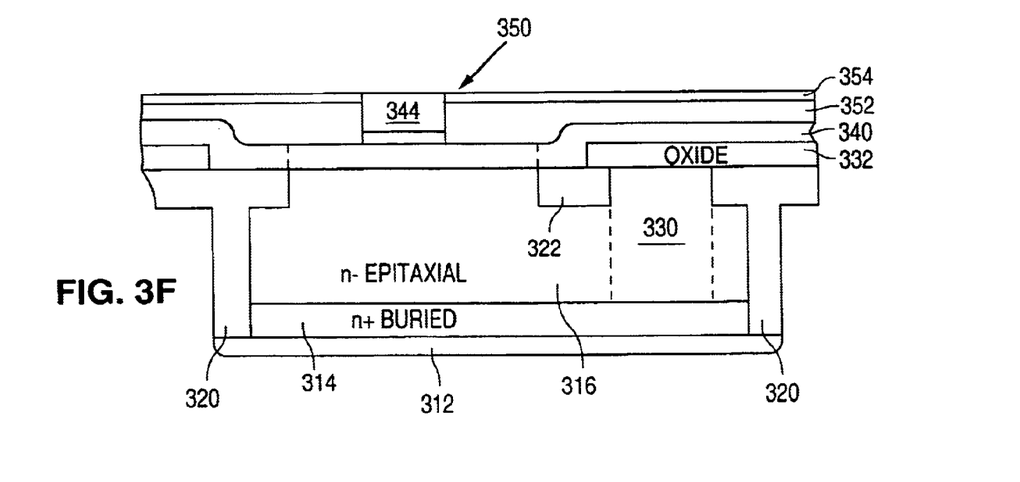
Figure 3G:
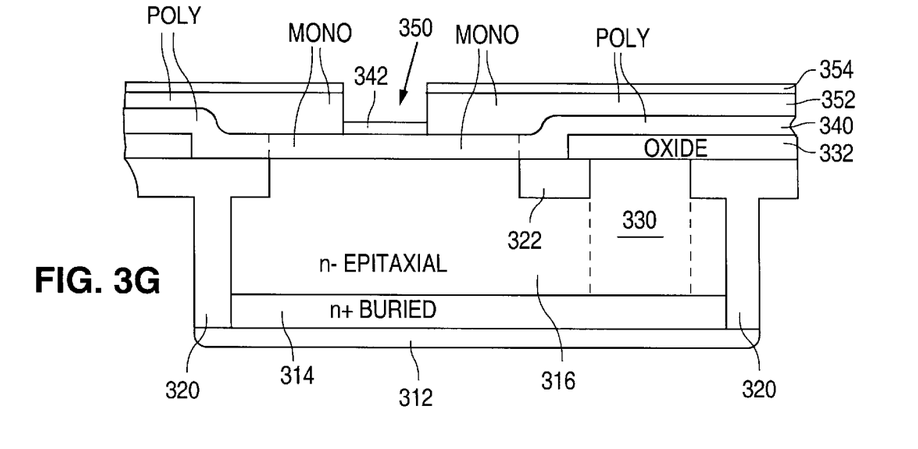

Following this, as shown in FIG. 3F, isolation layer 354 is planarized using a conventional approach, such as chemical-mechanical polishing, until mandrel 350 has been exposed. A portion of isolation layer 344 can also be removed during the polish. Next, as shown in FIG. 3G, a portion of mandrel 350, isolation layer 344 in the present example, is removed.

Figure 3H:
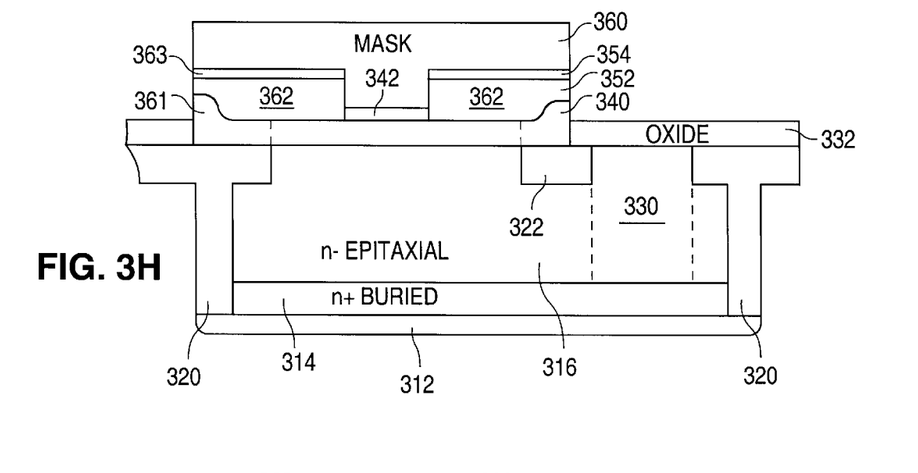

After isolation layer 344 has been removed, as shown in FIG. 3H, an extrinsic base definition mask 360 is formed and patterned on exposed isolation layer 342 and isolation layer 354 to expose a region of isolation layer 354. Once mask 360 has been patterned, the exposed regions of isolation layer 354 and underlying layers 340 and 352 are etched away to expose the surface of isolation layer 332. The etch defines an intrinsic base region 361 on epitaxial layer 316, a pair of extrinsic base regions 362 on intrinsic base region 361 and isolation caps 363 on base regions 362. Mask 360 is then stripped.

(Alternately, rather than removing a portion of mandrel 350 and then etching to form the intrinsic and extrinsic base regions 361 and the process can be reversed. In this case, isolation caps 363 and layers 352 and 340 are first etched, and then a portion of mandrel 350 is removed.)

Figure 3I:
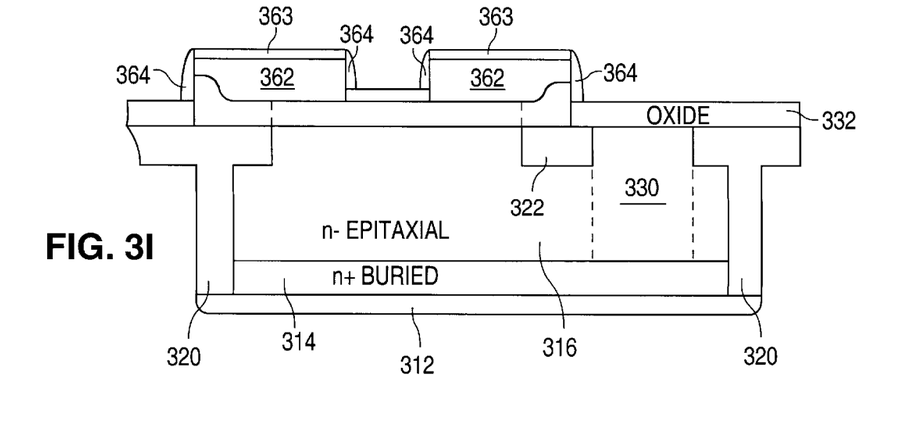

Following the removal of mask 360, a layer of isolation material, such as nitride, is deposited on isolation layers 332, 342, and 354. After this, as shown in FIG. 3I, the layer of isolation material is anisotropically etched to form isolation spacers 364 on the side walls of the extrinsic base regions 362.

Figure 3J:
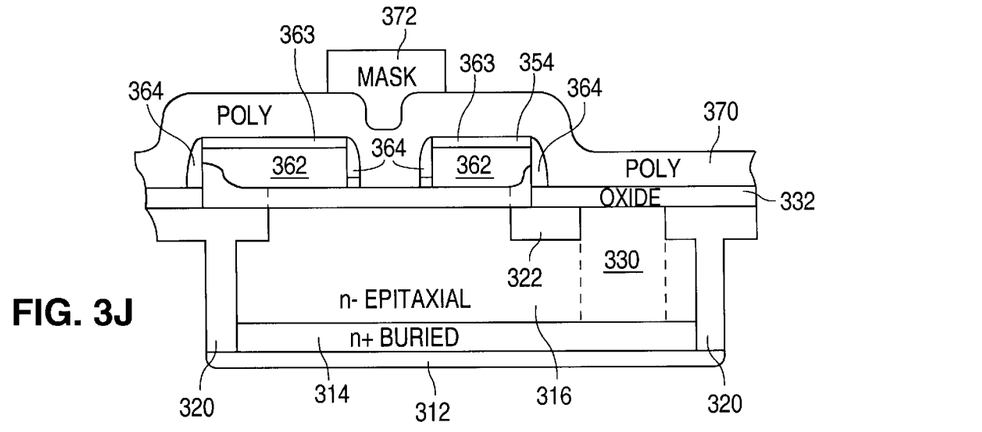

As shown in FIG. 3J, once isolation spacers 364 have been formed, isolation layer 342 is removed to expose layer 340. (Isolation layers 332 and 354 are also etched.) Following this, a layer of polysilicon 370 is formed on isolation layer 332, layer 340, isolation caps 363, and isolation spacers 364. Polysilicon layer 370 is then doped with, for example, arsenic using conventional techniques.

Figure 3K:
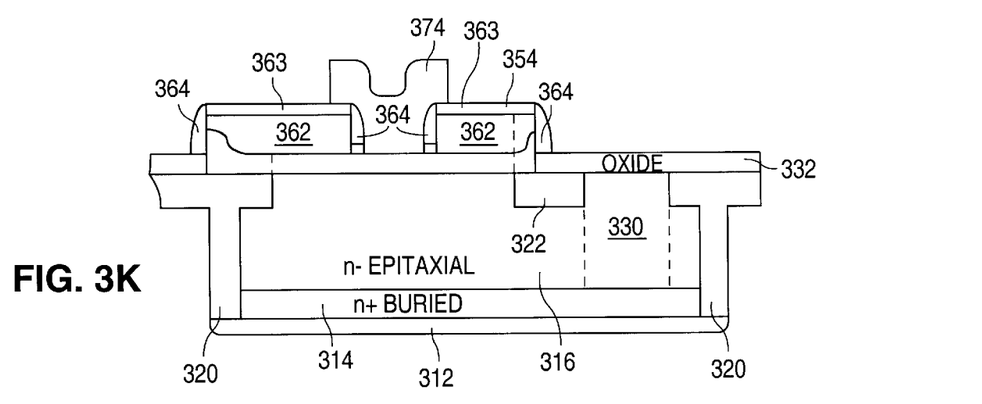

After polysilicon layer 370 has been doped, an emitter definition mask 372 is formed and patterned on polysilicon layer 370 to expose a region of layer 370. Once mask 372 has been patterned, the exposed regions of polysilicon layer 370 are etched away to expose the surface of isolation layer 332 and isolation caps 363. As shown in FIG. 3K, the etch defines an emitter 374. Mask 372 is then stripped.

Figure 3L:
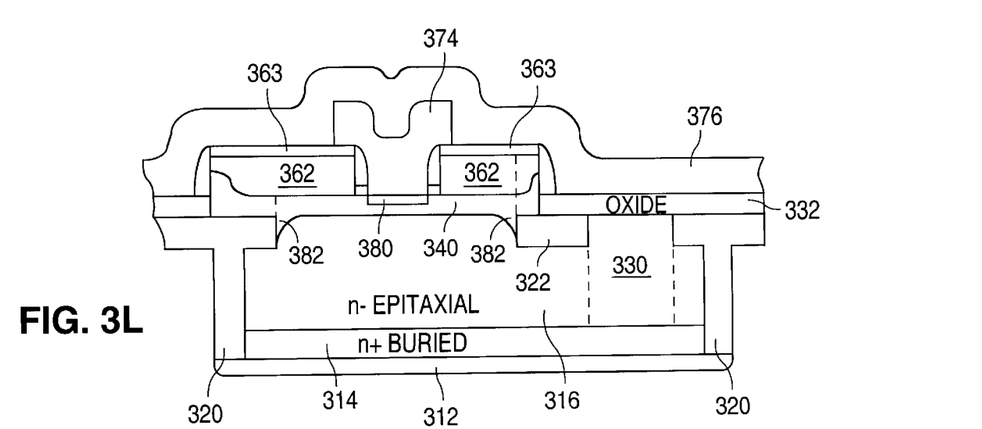

Following this, as shown in FIG. 3L, a layer of isolation material 376, such as oxide, is formed on isolation layer 332, isolation caps 363, isolation spacers 364, and emitter 374. Next, the wafer is thermally cycled to cause the arsenic from polysilicon emitter 374 to outdiffuse into layer 340 to form an intrinsic emitter region 380. In addition, boron from the extrinsic base regions 362 diffuses through intrinsic base region 340 into opposing corner regions 382 of epitaxial layer 316 to cover the corners of isolation regions 320 and 322, thereby reducing a collector-base leakage current.

Thus, a method of forming a bipolar transistor in accordance with the present invention has been described. The present method forms an intrinsic base before an extrinsic base layer is formed, and forms the extrinsic base layer with selective epitaxial growth. As a result, the problem with dopants from the highly-boron-doped extrinsic base region diffusing into the lightly-doped intrinsic base region can be substantially reduced. Thus, the present invention allows the formation of a very thin intrinsic base region.

It should be understood that various alternatives to the method of the invention described herein may be employed in practicing the invention. For example, although the method is described with respect to npn transistors, the method applies equally well to pnp transistors where the conductivity types are reversed.

In addition, the present method can be incorporated into a single poly or a double poly CMOS or BiCMOS process where emitter 374 is formed from either the first or the second layer of polysilicon. Thus, it is intended that the following claims define the scope of the invention and that methods and structures within the scope of these claims and their equivalents be covered thereby.

What is claimed is:

1. A bipolar transistor comprising:
   a layer of semiconductor material of a first conductivity type;
   an intrinsic base region of a second conductivity type formed on the layer of semiconductor material;
   spaced-apart extrinsic base regions of the second conductivity type formed on the intrinsic base region, the base regions having side walls;
   isolation caps formed on the extrinsic base regions;
   spacers that adjoin the side walls of the extrinsic base regions to contact the isolation caps;
   an intrinsic emitter of the first conductivity type that is formed in the surface of the intrinsic base region; and
   an extrinsic emitter of the first conductivity type that is formed on the isolation caps and the spacers to contact the intrinsic emitter region.

2. The bipolar transistor of claim 1 wherein the intrinsic base region includes silicon germanium, and the extrinsic base region includes single crystal silicon.

3. The bipolar transistor of claim 2 wherein the spacers include oxide and an overlying layer of nitride.

4. The bipolar transistor of claim 2 wherein the extrinsic base region has a dopant concentration substantially larger than the dopant concentration of the intrinsic base region.

5. A method of forming a bipolar transistor, the method comprising the steps of:
   forming a first layer of isolation material on a semiconductor material, the first layer of isolation material exposing a base surface area of the semiconductor material;
   forming a first layer of conductive material on the base surface area and the first layer of isolation material;
   forming a mandrel on the first layer of conductive material over the base surface area;
   forming a second layer of conductive material on the first layer of conductive material around the mandrel;
   forming a second layer of isolation material on the second layer of conductive material;
   removing a first portion of the mandrel after the second layer of isolation material has been formed;
   etching the second layer of isolation material, the second layer of conductive material, and the first layer of conductive material after the second layer of isolation material has been formed to form an intrinsic base region that contacts the base surface area, spaced-apart extrinsic base regions that contact the intrinsic base region, and isolation caps that contact and cover the extrinsic base regions, the base regions having side walls, and being separated by the mandrel;
   forming spacers on the side walls;
   removing a second portion of the mandrel after the base regions have been formed to expose a surface region of the first layer of conductive material; and
   forming an extrinsic emitter that contacts the surface region of the first layer of conductive material.

6. The method of claim 5 wherein the second layer of conductive material includes single crystal silicon.

7. The method of claim 6 wherein the second layer of conductive material is grown.

8. The method of claim 7 wherein the second layer of conductive material is epitaxially grown.

9. The method of claim 7 wherein the second layer of conductive material is doped and grown at a same time.

10. The method of claim 6 wherein the forming a mandrel step includes the steps of:
    forming a layer of sacrificial material on the first layer of conductive material; and
    etching the layer of sacrificial material to form the mandrel.

11. The method of claim 10 wherein the step of forming the layer of sacrificial material includes the steps of:
    forming a layer of oxide on the first layer of conductive material; and
    forming a layer of nitride on the layer of oxide.

12. The method of claim 6 wherein the step of forming an extrinsic emitter includes:
    forming a third layer of conductive material on the surface region of the first layer of conductive material, the side wall spacers, and the overlying layer of second isolation material; and
    etching the third layer of conductive material to form the extrinsic emitter.

13. The method of claim 12 wherein the intrinsic emitter is formed by out diffusion of dopant from the emitter.

14. The method of claim 6 and further comprising the step of forming an intrinsic emitter in the first layer of conductive material.

15. The method of claim 6 wherein the first layer of conductive material is silicon germanium.

16. The method of claim 6 wherein the first layer of conductive material is grown and doped while grown to have a conductivity type opposite to a conductivity type of the layer of semiconductor material.

17. The method of claim 6 wherein the extrinsic base regions are formed after the first portion of the mandrel has been removed.

* * * * *

UNITED STATES PATENT AND TRADEMARK OFFICE
CERTIFICATE OF CORRECTION

PATENT NO. : 6,699,741 B1
DATED : March 2, 2004
INVENTOR(S) : Sadovnikov et al.

It is certified that error appears in the above-identified patent and that said Letters Patent is hereby corrected as shown below:

Column 6,
Line 21, after "and" insert -- 362, --.

Signed and Sealed this

Twenty-second Day of June, 2004

JON W. DUDAS
*Acting Director of the United States Patent and Trademark Office*